(12) United States Patent
Wakizaka et al.

(10) Patent No.: US 6,270,900 B1
(45) Date of Patent: Aug. 7, 2001

(54) COMPOSITE FILM

(75) Inventors: Yasuhiro Wakizaka; Kei Sakamoto, both of Kanagawa (JP)

(73) Assignee: Nippon Zeon Co., Ltd., Tokyo (JP)

( * ) Notice: Subject to any disclaimer, the term of this patent is extended or adjusted under 35 U.S.C. 154(b) by 0 days.

(21) Appl. No.: 09/530,033

(22) PCT Filed: Nov. 2, 1998

(86) PCT No.: PCT/JP98/04949

§ 371 Date: Apr. 24, 2000

§ 102(e) Date: Apr. 24, 2000

(87) PCT Pub. No.: WO99/22936

PCT Pub. Date: May 14, 1999

(30) Foreign Application Priority Data

Oct. 31, 1997 (JP) .................................................. 9-315950

(51) Int. Cl.[7] ................................................... B32B 15/08
(52) U.S. Cl. ...................... 428/416; 428/209; 428/411.1; 428/413; 428/418
(58) Field of Search .............................. 428/411.1, 413, 428/416, 418, 209

(56) References Cited

U.S. PATENT DOCUMENTS

| Re. 34,638 | * | 6/1994 | Benedikt | 428/411.1 |
|---|---|---|---|---|
| 4,923,734 | * | 5/1990 | Benedikt | 428/209 |
| 5,091,263 | * | 2/1992 | Suzuki et al. | 428/411.1 |
| 5,137,785 | * | 8/1992 | Suzuki et al. | 428/411.1 |

FOREIGN PATENT DOCUMENTS

| 51-59989 | 5/1976 | (JP) . |
|---|---|---|
| 52-72780 | 6/1977 | (JP) . |
| 62-34924 | 2/1987 | (JP) . |
| 64-66216 | 3/1989 | (JP) . |
| 2-36224 | 2/1990 | (JP) . |
| 2133406 | 5/1990 | (JP) . |
| 2305814 | 12/1990 | (JP) . |
| 3-72512 | 2/1991 | (JP) . |
| 3-74409 | 2/1991 | (JP) . |
| 4185331 | 7/1992 | (JP) . |
| 5271356 | 10/1993 | (JP) . |
| 5320268 | 12/1993 | (JP) . |
| 6136057 | 5/1994 | (JP) . |
| 6172423 | 6/1994 | (JP) . |
| 6248164 | 9/1994 | (JP) . |
| 7258318 | 10/1995 | (JP) . |
| 9123351 | 2/1999 | (JP) . |

* cited by examiner

Primary Examiner—Cathy Lam
(74) Attorney, Agent, or Firm—Dinsmore & Shohl LLP

(57) ABSTRACT

A composite film having a layer structure of at least two layers, wherein a film (A) formed from a ring structure-containing polymer comprising a repeating unit derived from ring-opening or addition polymerization of a monomer having a ring structure, and a film (B) formed from a polycondensation polymer adjoin each other directly or through an adhesive layer.

22 Claims, No Drawings

COMPOSITE FILM

TECHNICAL FIELD

The present invention relates to composite films and more particularly to composite films of a multi-layer structure having a film of a polymer containing a specific ring structure and a film of a polycondensation polymer. The composite films according to the present invention are highly balanced among dielectric properties, low water absorption property, mechanical properties, flame retardancy, etc. and are hence particularly suitable for use as, for example, films for various kinds of wiring boards such as wiring films for semiconductor packages, films for flexible printed wiring boards and wiring films for semiconductor mounting.

BACKGROUND ART

With the rapid advancement of advanced information-oriented society in recent years, development of information processing apparatus such as computers and communication apparatus, and image processing apparatus such as camcorders and digital cameras is being rapidly advanced. In the field of these electronic apparatus, there is a strong demand for the enhancement of throughput capacity, i.e., the speeding up, and miniaturization and weight saving thereof. In this field, mounting parts such as semiconductor chips such as LSI, circuit parts and functional parts are mounted on a wiring board (substrate), and this wiring board is incorporated into an electronic apparatus. It is effective for the speeding up of information processing, image processing and the like to make the interconnected wiring of these mounting parts as short as possible so as to make the density of the parts high. This technique is also effective for the miniaturization and weight saving of electronic apparatus.

The use of a flexible substrate made of a synthetic resin film as a wiring board itself is effective to realize high-density assembly and the miniaturization and weight saving of electronic apparatus. Therefore, thin and freely flexible substrates are used in circuit boards such as printed wiring boards.

Even in a mounting system for electronic parts such as semiconductor chips, a system that semiconductor chips are mounted on a wiring board as bare chips is being developed in place of the conventional mounting system by transfer molding. In this mounting system, for example, TAB (tape automated bonding) in which a package itself for LSI is a plastic film (including a sheet) is known. TAB is generally formed from a tape-like carrier film, bumps (metallic projections) and a semiconductor chip. In such a mounting system, a flexible synthetic resin film having a wiring pattern is often used as the carrier film.

Polyimide has heretofore been used as a material for substrates of flexible printed wiring boards and films having a wiring pattern. However, a polyimide film is excellent in mechanical properties and flame retardant, but involves a problem that water absorptivity is high. Therefore, the use of the polyimide film as a substrate for high-density assembly has involved a problem that reliability on insulation is lowered due to water absorption, and the dielectric constant of the substrate is lowered due to moisture absorption. Accordingly, the polyimide film cannot be said to be a substrate material sufficiently satisfying recent high requirements.

On the other hand, ring structure-containing polymers such as ring-opening polymers and addition polymers of norbornene monomers such as tetracyclododecene are publicly known as insulating materials excellent in low water absorption property and dielectric properties, and techniques that glass cloth and the like are impregnated with these polymers to use them as substrates for printed wiring boards and that they are used in the form of a sheet as insulating films have been proposed (for example, Japanese Patent Application Laid-Open No. 248164/1994). However, these ring structure-containing polymers are generally insufficient in mechanical strength and flexibility and also poor in flame retardant, and so it has been difficult to use them singly as wiring boards and wiring films.

As described above, there has not been yet found any synthetic resin film which has sufficient mechanical strength and flame retardant as a film for flexible wiring boards and is excellent in low water absorption property and dielectric properties. There is a demand for development of novel films highly balanced among these various properties as materials for high-density assembly for realizing the speeding up of processing and the miniaturization and weight saving of apparatus.

DISCLOSURE OF THE INVENTION

It is an object of the present invention to provide a composite film having excellent low water absorption property, dielectric properties, mechanical properties and flame retardant and highly balanced among these various properties.

Another object of the present invention is to provide a film for wiring boards, which serves for the speeding up of processing and the miniaturization and weight saving of apparatus and has high reliability.

The present inventors have carried out an extensive investigation with a view toward overcoming the above-described problems involved in the prior art, resulting in conceiving composite films having a layer structure of at least two layers, in which a film (A) formed from a ring structure-containing polymer such as a thermoplastic norbornene resin and a film (B) formed from a polycondensation polymer such as polyimide adjoin each other directly or through an adhesive layer. When these two kinds of films are combined to form a multi-layer film, a composite film making the best use of their merits can be obtained.

More specifically, when these two kinds of films are combined to form a multi-layer film, a composite film highly balanced between various properties such as excellent low water absorption property and dielectric properties that the ring structure-containing polymer film (A) has, and various properties such as excellent mechanical properties and flame retardant that the polycondensation polymer film (B) has can be obtained. When the layer structure is devised, a composite film that a desired property among these various properties is made far excellent can be obtained.

When it is attempted to form a film of a blend of these two kinds of synthetic resins to improve the balance among the above-described various properties, it is necessary to solve a problem that compatibility between both resins is poor. In contrast, when films respectively formed from these two kinds of synthetic resins are combined to form a multi-layer film, the improvement in the various properties can be achieved without causing the problem of compatibility.

Upon the formation of the multi-layer film, a composite film can be formed with ease by using a film of one synthetic resin as a support and applying a solution of the other synthetic resin on to the support to form a film. When the polycondensation polymer is a thermosetting resin, a composite film can be formed by applying a solution of a precursor of such a resin on to the ring structure-containing polymer film (A), and then heat-treating it to be cured. When the ring structure-containing polymer contains a hardening agent, a solution containing the ring structure-containing polymer and the hardening agent can be applied on to a film of the polycondensation polymer and cured. It goes without saying that films of the respective resins may be laminated on each other to form a composite film. Further, the composite films according to the present invention can be used as films for wiring boards such as wiring boards for semiconductor packages, flexible printed wiring boards and wiring boards for semiconductor chip mounting, since a conductive layer can be formed on the surfaces thereof.

The present invention has be led to completion on the basis of these findings.

According to the present invention, there is thus provided a composite film having a layer structure of at least two layers, wherein a film (A) formed from a ring structure-containing polymer comprising a repeating unit derived from ring-opening or addition polymerization of a monomer having a ring structure, and a film (B) formed from a polycondensation polymer adjoin each other directly or through an adhesive layer.

BEST MODE FOR CARRYING OUT THE INVENTION

Film (A) Formed from Ring Structure-containing Polymer

The film (A) in the present invention is a film formed from a ring structure-containing polymer comprising a repeating unit derived from ring-opening or addition polymerization of a monomer having a ring structure. The ring structure-containing polymer may contain various kinds of compounding additives such as hardening agents, flame retardants, stabilizers, fillers and other synthetic resins as needed.

(Polymer)

The "ring structure-containing polymer comprising a repeating unit derived from ring-opening or addition polymerization of a monomer having a ring structure" useful in the practice of the present invention is a homopolymer or copolymer containing a ring structure in its main chain and/or side chain and is preferably a polymer containing a ring structure in its main chain from the viewpoints of mechanical strength, heat resistance and the like. Examples of the ring structure include aromatic ring structures, saturated cyclic hydrocarbons (cycloalkanes) structures, unsaturated cyclic hydrocarbons (cycloalkenes) structures, etc. Among these, the cycloalkane structures are particularly preferred from the viewpoints of mechanical strength, heat resistance and the like. Accordingly, when the ring structure is an aromatic ring or unsaturated cyclic hydrocarbon, a hydrogenation reaction is preferably conducted after the polymerization of monomer(s) to convert such a structure into a cycloalkane structure.

Examples of the ring structure include monocycles, polycycles, fused polycycles, bridged rings and polycycles composed of these combinations. No particular limitation is imposed on the number of carbon atoms forming the ring structure. However, it is generally preferred that the number be within a range of 4 to 30, preferably 5 to 20, more preferably 5 to 15, since the properties of mechanical strength, heat resistance and moldability of the resulting polymer are balanced at a high level.

The bonding style of the monomer having a ring structure is ring-opening polymerization or addition polymerization. As examples of the ring structure-containing polymer, may be mentioned:

(a) ring-opening or addition (co)polymers of norbornene monomers having a norbornene ring, such as norbornene and derivatives thereof, tetracyclododecene and derivatives thereof, and cyclopentadiene and derivatives thereof;

(b) addition (co)polymers of monocyclic cycloolefin monomers such as cyclopentene and cyclohexene;

(c) addition (co)polymers of cyclic conjugated diene monomers such as cyclopentadiene and cyclohexadiene by addition at a 1,3- or 1,4-position;

(d) addition (co)polymers of vinyl cyclic hydrocarbons such as vinylcyclohexene, vinylcyclohexane and styrene; and (e) modified products of these (co)polymers.

As examples of the ring-opening or addition (co)polymers (a) of the norbornene monomers, may be mentioned:

(1) ring-opening (co)polymers of the norbornene monomers;

(2) addition (co)polymers of the norbornene monomers; and (3) addition copolymers of the norbornene monomer with another monomer (for example, α-olefin) copolymerizable with the norbornene monomer.

Examples of the modified products (e) of the (co) polymers, may be mentioned those obtained by respectively modifying the polymers (a) to (d) by a modification reaction selected from the group consisting of:

① a hydrogenation reaction of carbon-carbon unsaturated bonds;

② a graft reaction of a functional group-containing unsaturated compound;

③ a reaction for introducing a functional group by direct modification of a carbon-carbon unsaturated bond; and ④ combinations of these reactions.

In the present invention, the "repeating unit derived from ring-opening or addition polymerization of a monomer having a ring structure" also includes repeating units modified by a hydrogenation reaction, a graft reaction or the like after polymerization.

These ring structure-containing polymers may be used either singly or in any combination thereof.

Among these ring structure-containing polymers, those having excellent balance between heat resistance and film-forming property (particularly, flexibility) are preferred. As the ring structure-containing polymers having such excellent properties, are preferred the ring-opening (co)polymers and addition (co)polymers of the norbornene monomers, and modified products thereof. Thermoplastic norbornene resins such as these norbornene polymers and modified products thereof are also excellent in mechanical strength, molding and processing ability, etc.

The ring structure-containing polymers desirably contain the repeating unit derived from the monomer having a ring structure in a proportion of generally at least 50 mol %, preferably at least 70 mol %, more preferably at least 80 mol % based on the whole repeating unit of the polymer.

When a monomer having an organic group having two or more carbon atoms in a side chain is used as the monomer having a ring structure either singly or in combination with another monomer having a ring structure, a ring structure-containing polymer film excellent in flexibility, adhesion property to metals, etc. can be obtained. Examples of such an organic group include hydrocarbon groups, oxygen-containing organic groups, nitrogen-containing organic groups, etc. The organic group having two or more carbon atoms is preferably a hydrocarbon group having 2 to 20 carbon atoms, and examples thereof include alkyl and alkylidene groups such as ethyl, ethylidene, propylene, butyl, pentyl, hexyl, octyl, decyl, butylidene, pentylidene, hexylidene and decylidene groups. Among these groups, linear alkyl groups are preferred. The number of carbon atoms in the organic group is preferably 4 to 20 atoms, more preferably 6 to 12 atoms.

The proportion of the "monomer having an organic group having two or more carbon atoms in a side chain"0 in the monomer(s) having a ring structure is within a range of preferably 5 to 100 mol %, more preferably 10 to 70 mol %. Specific examples of such a ring structure-containing polymer include ring-opening polymers of ethyltetracyclododecene and ethylidenetetracyclododecene, addition copolymers of norbornene and decylnorbornene, addition copolymers of norbornene and hexylnorbornene, and modified product thereof.

(Monomer Having a Ring Structure)

The monomer having a ring structure used in the present invention will hereinafter be described more specifically.

(i) Norbornene Monomer

The norbornene monomer used in the present invention is a alicyclic monomer having a norbornene ring, which is described in, for example, Japanese Patent Application Laid-Open Nos. 320268/1993 and 36224/1990. Typical examples thereof include monomers having no other unsaturated bond than a carbon-carbon unsaturated bond participating in a polymerization reaction, such as norbornene, tetracyclododecene and alkyl-substituted products thereof; monomers having another unsaturated bond in addition to a carbon-carbon unsaturated bond participating in a polymerization reaction, such as ethylidenenorbornene, vinylnorbornene, ethylidenetetracyclododecene and dicyclopentadiene; monomers having an aromatic ring, such as dimethanotetrahydrofluorene and phenylnorbornene; and monomers having a functional group (particularly, a polar group), such as methoxycarbonylnorbornene and methoxycarbonyltetracyclododecene.

Specific examples of the monomer having no other unsaturated bond than a carbon-carbon unsaturated bond participating in a polymerization reaction include bicyclo[2.2.1]hept-2-ene derivatives such as bicyclo[2.2.1]hept-2-ene (i.e. norbornene), 5-methylbicyclo[2.2.1]hept-2-ene, 5-ethylbicyclo[2.2.1]hept-2-ene, 5-butylbicyclo[2.2.1]hept-2-ene, 5-hexylbicyclo[2.2.1]hept-2-ene and 5-decylbicyclo[2.2.1]hept-2-ene; tetracyclo[4.4.1$^{2,5}$.1$^{7,10}$.0 ]-dodec-3-ene derivatives such as tetracyclo[4.4.1$^{2,5}$.1$^{7,10}$.0]-dodec-3-ene (i.e. tetracyclododecene), 8-methyltetracyclo[4.4.1$^{2,5}$.1$^{7,10}$.0]-dodec-3-ene and 8-ethyltetracyclo[4.4.1$^{2,5}$.1$^{7,10}$.0]-dodec-3-ene; tricyclo[4.3.1$^{2,5}$.0]-dec-3-ene; and bicyclo[2.2.1]hept-2-ene derivatives having a cyclic substituent group, such as 5-cyclohexylbicyclo[2.2.1]hept-2-ene and 5-cyclopentyl-bicyclo[2.2.1]hept-2-ene.

Specific examples of the monomer having another unsaturated bond in addition to a carbon-carbon unsaturated bond participating in a polymerization reaction include bicyclo[2.2.1]hept-2-ene derivatives having an unsaturated bond outside its ring, such as 5-ethylidenebicyclo[2.2.1]hept-2-ene, 5-vinylbicyclo[2.2.1]hept-2-ene and 5-propenylbicyclo[2.2.1]hept-2-ene; tetracyclo[4.4.1$^{2,5}$.1$^{7,10}$.0]-dodec-3-ene derivatives having an unsaturated bond outside its ring, such as 8-methylidenetetracyclo[4.4.1$^{2,5}$.1$^{7,10}$.0]-dodec-3-ene, 8-ethylidenetetracyclo[4.4.1$^{2,5}$.1$^{7,10}$.0]-dodec-3-ene, 8-vinyltetracyclo[4.4.1$^{2,5}$.1$^{7,10}$.0]-dodec-3-ene and 8-propenyltetracyclo[4.4.1$^{2,5}$.1$^{7,10}$.0]-dodec-3-ene; tricyclo[4.3.1$^{2,5}$.0]-dec-3,7-diene; and bicyclo[2.2.1]hept-2-ene derivatives having a cyclic substituent group with an unsaturated bond, such as 5-cyclohexenylbicyclo[2.2.1]hept-2-ene and 5-cyclopentenylbicyclo[2.2.1]hept-2-ene.

Specific examples of the monomer having an aromatic ring include 5-phenylbicyclo[2.2.1]hept-2-ene, tetracyclo[6.5.1$^{2,5}$.0$^{1,6}$.0$^{8,13}$]tridec-3,8,10,12-tetraene (also referred to as 1,4-methano-1,4,4a,9a-tetrahydrofluorene) and tetracyclo[6.6.1$^{2,5}$.0$^{1,6}$.0$^{8,13}$]tetradec-3,8,10,12-tetraene (also referred to as 1,4-methano-1,4,4a,5,10,10a-hexahydroanthracene).

Specific examples of the monomer having a functional group (especially, polar group) include bicyclo[2.2.1]hept-2-ene derivatives having at least one substituent group containing an oxygen atom, such as 5-methoxycarbonylbicyclo[2.2.1]hept-2-ene, 5-ethoxycarbonylbicyclo[2.2.1]hept-2-ene, 5-methyl-5-methoxycarbonylbicyclo[2.2.1]hept-2-ene, 5-methyl-5-ethoxycarbonylbicyclo[2.2.1]hept-2-ene, bicyclo[2.2.1]hept-5-enyl-2-methylpropionate, bicyclo[2.2.1]hept-5-enyl-2-methyloctanoate, bicyclo[2.2.1]hept-2-ene-5,6-dicarboxylic acid anhydride, 5-hydroxymethylbicyclo[2.2.1]hept-2-ene, 5,6-di(hydroxymethyl)bicyclo[2.2.1]hept-2-ene, 5-hydroxyisopropylbicyclo[2.2.1]hept-2-ene and 5,6-dicarboxybicyclo[2.2.1]hept-2-ene; tetracyclo[4.4.1$^{2,5}$.1$^{7,10}$.0]-dodec-3-ene derivatives having at least one substituent group containing an oxygen atom, such as 8-methoxycarbonyltetracyclo[4.4.1$^{2,5}$.1$^{7,10}$.0]-dodec-3-ene, 8-methyl-8-methoxycarbonyltetracyclo[4.4.1$^{2,5}$.1$^{7,10}$.0]-dodec-3-ene, 8-hydroxymethyltetracyclo[4.4.1$^{2,5}$.1$^{7,10}$.0]-dodec-3-ene and 8-carboxytetracyclo[4.4.1$^{2,5}$.1$^{7,10}$.0]-dodec-3-ene; and bicyclo[2.2.1]hept-2-ene derivatives having at least one substituent group containing a nitrogen atom, such as 5-cyanobicyclo[2.2.1]hept-2-ene and bicyclo[2.2.1]hept-2-ene-5,6-dicarboxylic acid imide.

In addition, in all the above-mentioned norbornene monomers in common, there may be mentioned norbornene monomers having an organic group having two or more, preferably four or more carbon atoms, preferably a hydrocarbon group, more preferably an alkyl group as a substituent group.

These norbornene monomers can be subjected to ring-opening (co)polymerization or addition (co)polymerization in accordance with a method known per se in the art. In addition, these norbornene monomers may be subjected to addition copolymerization with another monomer (for example, an α-olefin which will be described subsequently) copolymerizable therewith.

(ii) Monocyclic Cycloolefin Monomer

The monocyclic cycloolefin monomer is a cyclic compound having a carbon-carbon double bond in its ring. Specific examples thereof include cyclobutene, cyclopentene, cyclohexene, cycloheptene, cycyclooctene and substituted derivatives (for example, alkyl-substituted products and polar group-substituted products) thereof (for example, Japanese Patent Application Laid-Open No. 66216/1989). These monocyclic cycloolefin monomers may be used either singly or in any combination thereof.

(iii) Cyclic Conjugated Diene Monomer

The cyclic conjugated diene monomer is a cyclic compound having conjugated carbon-carbon double bonds in its ring. Specific examples thereof include 1,3-cyclopentadiene, 1,3-cyclohexadiene, 1,3-cycloheptadiene, 1,3-cyclooctadiene and substituted derivatives (for example, alkyl-substituted products and polar group-substituted products) thereof (for example, Japanese Patent Application Laid-Open Nos. 136057/1994 and 258318/1995). These cyclic conjugated diene monomers can be polymerized in accordance with a publicly known process to obtain 1,3- or 1,4-addition (co)polymers. These cyclic conjugated diene monomers may be used either singly on in any combination thereof.

(iv) Vinyl Cyclic Hydrocarbon Monomer

Examples of the vinyl cyclic hydrocarbon monomer include vinyl cyclic hydrocarbons such as vinylcyclopentene, vinylcyclopentane, vinylcyclohexene, vinylcyclohexane, vinylcycloheptene, vinylcycloheptane, vinylcyclooctene, vinylcyclooctane and substituted derivatives (for example, alkyl-substituted products and polar group-substituted products) thereof (for example, Japanese Patent Application Laid-Open No. 59989/1976). In addition, aromatic vinyl monomers such as styrene and α-methylstyrene may also be mentioned. These monomers may be addition-(co)polymerized in accordance with a method known per se in the art. When an unsaturated bond is contained in the ring, the resulting polymer is preferably hydrogenated after polymerization.

Among these, the ring structure is preferably a 5- to 7-membered ring from the viewpoint of balance among heat resistance, moldability and strength properties, with vinylcyclohexene polymers, vinylcyclohexane polymers or hydrogenated products thereof, and aromatic vinyl polymers or hydrogenated products thereof being most preferred.

(v) Copolymerizable Another Monomer

In the present invention, the monomer having a ring structure may be subjected to addition (co)polymerization with another monomer copolymerizable therewith as needed.

Examples of another monomer include α-olefins having 2 to 12 carbon atoms, such as ethylene, propylene, 1-butene, 4-methyl-1-pentene; linear conjugated dienes such as 1,3-butadiene and isoprene; vinyl ethers such as ethyl vinyl ether and isobutyl vinyl ether; and carbon monoxide. A copolymer obtained by using the α-olefin among these to addition-copolymerize it with the norbornene monomer is preferred as the ring structure-containing polymer.

(Modified Product)

As the ring structure-containing polymer useful in the practice of the present invention, the ring-opening or addition (co)polymer of the monomer having a ring structure may be used as it is. When an unsaturated bond is present in the main chain, side chain or ring structure thereof, however, it is preferred to conduct a hydrogenation reaction to saturate it from the viewpoint of heat stability and long-term reliability. The ring-structure-containing polymer is preferably that into which a functional group has been introduced for the purpose of improving the adhesion property to a conductive layer (wiring layer) on a film (A) formed thereof and the film (B). Both hydrogenation and introduction of the functional group may be conducted.

The hydrogenated product can be obtained by hydrogenating the ring-opening or addition (co)polymer of the monomer having a ring structure with hydrogen in the presence of a hydrogenation catalyst in accordance with a method known per se in the art. The carbon-carbon unsaturated bond present in the main chain or side chain is partially or wholly hydrogenated with hydrogen to saturate it. When the polymer has an aromatic ring, the aromatic ring may be hydrogenated by hydrogenation. In the case of a norbornene polymer having an aromatic ring, only unsaturated bonds in the main chain and side chain may be hydrogenated to retain the aromatic ring as it is.

As the functional group introduced into the ring-opening or addition (co)polymer of the monomer having a ring structure, is preferred a functional group (polar group) composed of an organic group having a heteroatom and having a polarity. Examples of the heteroatom include oxygen, nitrogen, sulfur, silicon and halogens. Polar groups having an oxygen or nitrogen atom is preferred from the viewpoints of adhesion property and reactivity.

The ring structure-containing polymer used in the present invention may be formed into a film to combine it with the film (B) of the polycondensation polymer, and a conductive layer (wiring layer) may be further formed thereon. The ring structure-containing polymer may be provided as a curable resin by containing a hardening agent therein. Therefore, the polar group introduced is preferably such a polar group as improves the adhesion property to mainly the wiring layer and the film (B) or has a function of serving as a hardening site upon hardening reaction.

Specific example of the functional group include epoxy, carboxyl, hydroxyl, ester, silanol, silyl, amino, nitrile, halogeno, acyl, sulfone and vinyl groups.

Of these, oxygen-containing functional groups capable of reacting with an acid or basic hardening agent such as a polyhydric phenol or amine, for example, polar groups such as epoxy, acid anhydride, carboxyl and hydroxyl groups are preferred for reasons of, for example, (1) making it possible to enhance crosslinking density and adhesion property at a low modification rate, (2) permitting the selection of a hardening agent from a wide range, and (3) easily controlling a curing rate with the hardening agent, with functional groups which generate a terminal-OH group such as a hydroxyl or carboxyl group after curing, for example, epoxy and acid anhydride groups being particularly preferred. These functional groups may be used either singly or in any combination thereof.

The rate of introduction of the functional group is suitably selected as necessary for the end application intended. However, it is generally within a range of 0.1 to 100 mol %, preferably 2 to 80 mol %, more preferably 5 to 50 mol % based on the whole repeating unit in the polymer. When the rate of introduction of the functional group in the ring structure-containing polymer falls within this range, the adhesion strength to metals, heat resistance, mechanical strength, water absorptivity and dielectric properties of the polymer are balanced with one another at a high level. It is hence preferable to introduce the functional group at a rate of introduction within the above range.

Examples of a process for the introduction of the functional group include a process in which a ring-opening or addition (co)polymer of the monomer having a ring structure, or a hydrogenated product thereof is modified, and a process in which a monomer having a functional group is copolymerized upon the preparation of the (co)polymer. Specific examples thereof include (1) a process in which a unsaturated compound having a functional group is introduced into the ring-opening or addition (co)polymer of the monomer having a ring structure, or a hydrogenated product thereof by a graft reaction (graft modification process), (2) a process in which a functional group is directly added to a carbon-carbon unsaturated bond in the (co)polymer or the hydrogenated product thereof when the carbon-carbon unsaturated bond is present therein (direct modification process), and (3) a process in which a monomer having a functional group is copolymerized in advance upon the preparation of the (co)polymer (copolymerization process).

With respect to the case where a polar group is used as the functional group, the respective processes will hereinafter be described in detail. Incidentally, the copolymerization process (3) is not a modification process, but it is described here for the sake of convenience.

(1) Graft Reaction of Polar Group-containing Unsaturated Compound

The introduction of a polar group by the graft modification process can be conducted by reacting the ring-opening or addition (co)polymer of the monomer having a ring structure, or a hydrogenated product thereof with a polar group-containing unsaturated compound in the presence of a radical generator such as an organic peroxide. No particular limitation is imposed on the polar group-containing unsaturated compound. However, epoxy group-containing unsaturated compounds, carboxyl group-containing unsaturated compounds, hydroxyl group-containing unsaturated compounds, silyl group-containing unsaturated compounds, etc. are preferred because making it is possible to enhance crosslinking density and adhesion property to the conductive layer and film (B) at a low modification rate, and photosensitivity can be imparted as needed.

Examples of the epoxy group-containing unsaturated compounds include glycidyl esters such as glycidyl acrylate, glycidyl methacrylate and glycidyl p-styrylcarboxylate; mono- or polyglycidyl esters of unsaturated polycarboxylic acids such as endo-cis-bicyclo[2,2,1]hept-5-ene-2,3-dicarboxylic acid and endo-cis-bicyclo[2,2,1]hept-5-ene-2-methyl-2,3-dicarboxylic acid; unsaturated glycidyl ethers such as allyl glycidyl ether, 2-methylallyl glycidyl ether, glycidyl ether of o-allylphenol, glycidyl ether of m-allylphenol and glycidyl ether of p-allylphenol; and 2-(o-vinylphenyl)ethylene oxide, 2-(p-vinylphenyl)ethylene oxide, 2-(o-allylphenyl)ethylene oxide, 2-(p-allylphenyl)ethylene oxide, 2-(o-vinylphenyl)propylene oxide, 2-(p-vinylphenyl)propylene oxide, 2-(o-allylphenyl)propylene oxide, 2-(p-allylphenyl)propylene oxide, p-glycidylstyrene, 3,4-epoxy-1-butene, 3,4-epoxy-3-methyl-1-butene, 3,4-epoxy-1-pentene, 3,4-epoxy-3-methyl-1-pentene, 5,6-epoxy-1-hexene, vinylcyclohexene monoxide and allyl-2,3-epoxycyclopentyl ether.

Of these, the allyl glycidyl esters, allyl glycidyl ethers and 5,6-epoxy-1-hexene etc. are preferred, with the allyl glycidyl ethers being particularly preferred, in that such an epoxy group-containing unsaturated compound permits graft addition at a particularly high reaction rate. These epoxy group-containing unsaturated compounds may be used either singly or in any combination thereof.

As examples of the carboxyl group-containing unsaturated compounds, may be mentioned compounds described in Japanese Patent Application Laid-Open No. 271356/1993, for example, unsaturated carboxylic acids such as acrylic acid, methacrylic acid and α-ethylacrylic acid; and unsaturated dicarboxylic acid such as maleic acid, fumaric acid, itaconic acid, endo-cis-bicyclo-[2.2.1]hept-5-ene-2,3-dicarboxylic acid and methyl-endo-cis-bicyclo[2.2.1]hept-5-ene-2,3-dicarboxylic acid. As examples of the unsaturated carboxylic acid derivatives, may be mentioned anhydrides, esters, halides, amides and imides of unsaturated carboxylic acids, and specific examples thereof include acid anhydrides such as maleic anhydride, chloromaleic anhydride, butenyl-succinic anhydride, tetrahydrophthalic anhydride and citraconic anhydride; esters such as monomethyl maleate, dimethyl maleate and glycidyl maleate; and malenyl chloride and maleimide. Of these, acid anhydrides such as maleic anhydride and itaconic anhydride are particularly preferred for the above-described reasons.

Examples of the hydroxyl group-containing unsaturated compounds include allyl alcohol, 2-allyl-6-methoxyphenol, 4-allyloxy-2-hydroxybenzophenone, 3-allyloxy-1,2-propanediol, 2-allyloxy-phenol, 3-buten-1-ol, 4-penten-1-ol and 5-hexen-1-ol.

Examples of the silyl group-containing unsaturated compounds include chlorodimethylvinylsilane, trimethylsilylacetylene, 5-trimethylsilyl-1,3-cyclopentadiene, 3-trimethylsilylallyl alcohol, trimethylsilyl methacrylate, 1-trimethylsilyloxy-1,3-butadiene, 1-trimethylsilyloxycyclopentene, 2-trimethylsilyloxyethyl methacrylate, 2-trimethylsilyloxyfuran, 2-trimethylsilyloxypropene, allyloxy-t-butyldimethylsilane and allyloxytrimethylsilane.

Unsaturated organosilicon compounds include trisalkoxyvinylsilanes such as trimethoxyvinylsilane, triethoxyvinylsilane, tris(methoxyethoxy)vinylsilane. The alkoxy groups in such an unsaturated organosilicon compounds can be hydrolyzed into silanol groups.

The graft-modified ring structure-containing polymer can be obtained by graft-reacting the unsaturated compound having a functional group such as a polar group with the ring-opening or addition (co)polymer of the monomer having a ring structure, or a hydrogenated product thereof under generation of a radical. As methods for generating the radical, may be mentioned (i) a method making use of an organic peroxide, (ii) a method making use of a photo-induced radical generator, (iii) a method by irradiation of energy rays, and (iv) a method by heating.

As the radical initiator, an organic peroxide is generally used. The organic peroxide is preferably the same as that which will be described subsequently in the item of the hardening agent. An azo compound may also be used as the radical generator. As specific examples of the azo compound, may be mentioned azobisisobutyronitrile and dimethyl azoisobutyrate. Of these, dialkyl peroxides are preferably used as the organic peroxides. These organic peroxides may be used either singly or in any combination thereof.

A proportion of the organic peroxide used is generally within a range of 0.001 to 30 parts by weight, preferably 0.01 to 20 parts by weight, more preferably 0.1 to 15 parts by weight per 100 parts by weight of the (co)polymer or the hydrogenated product thereof in terms of a charged proportion upon the reaction. When the proportion of the organic peroxide used falls within this range, the rate of reaction of the polar group-containing unsaturated compound, and various properties of the resulting functional group-containing polymer, such as water absorptivity and dielectric properties, are balanced with one another at a high level. It is hence preferable to use the organic peroxide within such a range.

No particular limitation is imposed on the graft-modification reaction, and the reaction may be carried out in accordance with a method known per se in the art. The reaction is conducted at a temperature of generally 0 to 400° C., preferably 60 to 350° C. The reaction time is generally within a range of 1 minute to 24 hours, preferably 30 minutes to 10 hours. After completion of the reaction, a poor solvent such as methanol is added in a great amount to the reaction system to deposit a polymer formed, and the polymer can be collected by filtration, washed and then dried under reduced pressure.

(2) Direct Modification of Carbon-carbon Unsaturated Bond

Into the ring structure-containing polymer according to the present invention, a polar group can be introduced by using carbon-carbon unsaturated bond in the ring-opening or addition (co)polymer of the monomer having a ring structure or the hydrogenated product thereof to add the polar group thereto or bond a compound having a polar group thereto.

No particular limitation is imposed on the process for introducing the polar group. However, an example thereof includes a process in which a polar group such as an epoxy group, carboxyl group or hydroxyl group is introduced in accordance with any one of (i) a method by oxidation of unsaturated bonds, (ii) a method by an addition reaction of a compound containing at least one polar group in its molecule to unsaturated bonds, and (iii) any other method (for example, Japanese Patent Application Laid-Open No. 172423/1994).

(3) Copolymerization of Polar Group-containing Monomer

No particular limitation is imposed on the functional group-containing monomer. In the case of a norbornene polymer, however, it is preferred to copolymerize any one of such norbornene monomers having a polar group such as a hydroxyl, carboxyl or ester group as mentioned above as the examples of the norbornene monomers, for example, 5-hydroxymethylnorbornene, 5-hydroxyisopropylnorbornene, 5-methoxycarbonylnorbornene, 8-methoxycarbonyltetracyclododecene or 5,6 - dicarboxynorbornene. With respect to a polymerization catalyst and a polymerization process, publicly known polymerization catalysts and polymerization processes for norbornene monomers may be used.

Of the above-described processes, the graft-modification process is preferred as the process for introducing the polar group for reasons of, for example, the fact that the modification can be carried out under easy reaction conditions and that the functional group can be easily introduced at a high modification rate. As the kind of the polar group-containing unsaturated compound subjected to the graft reaction, is particularly preferred an unsaturated compound having an epoxy group or an unsaturated compound having a dicarboxylic acid anhydride group and a carbon-carbon unsaturated bond in its molecule, such as maleic anhydride or itaconic anhydride for the above-described reasons.

The rate of introduction of the functional group in the ring structure-containing polymer having a functional group used in the present invention is suitably selected as necessary for the end application intended. However, it is generally within a range of 0.1 to 100 mol %, preferably 0.5 to 50 mol %, more preferably 1 to 30 mol % based on the whole repeating unit (the total number of monomer units) in the polymer. When the rate of introduction of the functional group in the ring structure-containing polymer falls within this range, the film-forming property, strength properties, heat resistance, solvent resistance and dielectric properties of the polymer are balanced with one another at a high level. It is hence preferable to introduce the functional group at a rate of introduction within the above range.

The rate of introduction of the functional group (modification rate: mol %) is represented by the following equation (1):

$$\text{Rate of introduction of the functional group} = (X/Y) \times 100 \quad (1)$$

wherein

X:
  (a) the total number of moles of modification residue introduced by a graft monomer,
  (b) (the total number of moles of unsaturated bond-containing monomer)×(rate of addition of functional group to unsaturated bonds), or
  (c) the total number of moles of the functional group-containing monomer
    (all, determined by $^1$H-NMR); and Y: the total number of monomer units in the polymer (weight average molecular weight of the polymer/ average molecular weight of the monomer).

(Physical Properties of Ring Structure-containing Polymer)

The molecular weight of the ring structure-containing polymer used in the present invention is suitably selected as necessary for the end application intended, but is generally within a range of 1,000 to 1,000,000, preferably 5,000 to 500,000, more preferably 10,000 to 250,000, most preferably 2,000 to 200,000 when expressed by a weight average molecular weight (Mw) as measured by gel permeation chromatography (GPC) using toluene as a solvent. When the Mw of the ring structure-containing polymer falls within this range, the mechanical strength and flexibility of the polymer are balanced with each other at a high level. It is hence preferable to use a polymer having a molecular weight within such a range.

The molecular weight distribution of the ring structure-containing polymer used in the present invention is suitably selected as necessary for the end application intended. However, it is preferred that its ratio (Mw/Mn) of the weight average molecular weight (Mw) to the number average molecular weight (Mn) as measured by GPC using toluene as a solvent be generally 5.0 or lower, preferably 4.0 or lower, more preferably 3.0 or lower, since the mechanical strength and flexibility of the polymer are balanced with each other at a high level.

These ring structure-containing polymers may be used either singly or in any combination thereof.

(Compounding Additives)

The film (A) used in the present invention may be formed by mixing compounding additives with the ring structure-containing polymer as needed. More specifically, the ring structure-containing polymer can be used as a resin composition comprising various kinds of additives. Examples of the compounding additives include hardening agents, hardening auxiliaries, flame retardants, stabilizers, fillers and other resins.

It is particularly preferred that a hardening agent be incorporated into the ring structure-containing polymer to use the polymer as a curable resin composition for the purpose of improving the heat resistance and strength properties of the film (A).

Hardening Agent

No particular limitation is imposed on the hardening agent used in the present invention, and examples thereof include (1) organic peroxides, (2) hardening agents capable of exhibiting their effect by heat, and (3) hardening agents capable of exhibiting their effect by light.

Besides, hardening agents may also be classified into (i) those (organic peroxides, quinone and quinone dioxime derivatives, azo compound, etc.) which form a radical to develop the effect, and (ii) those (phenol resins, amino resins, halogen compounds, amine compounds, aziridine compounds, isocyanate compounds, carboxylic acids, acid anhydrides, aldehydes, epoxy compounds, metal oxides, sulfides, metal halides, organometal halides, silane compounds, epoxy resin-hardening agents, etc.) which form an ion as an acid or base to develop the effect. In the present specification, specific examples of the hardening agent will be described in more detail in accordance with the former classification.

(1) Organic Peroxide

Examples of the organic peroxide include ketone peroxides such as methyl ethyl ketone peroxide and cyclohexanone peroxide; peroxyketals such as 1,1-bis(t-butyl peroxy)-3,3,5-trimethylcyclohexane and 2,2-bis(t-butyl peroxy)butane; hydroperoxides such as t-butyl hydroperoxide and 2,5-dimethylhexane-2,5-dihydroperoxide; dialkyl peroxides such as dicumyl peroxide, 2,5-dimethyl-2,5-di(t- butyl peroxy)hexyne-3 and α,α'-bis(t-butyl peroxy-m-isopropyl)benzene; diacyl peroxides such as octanoyl peroxide and isobutyryl peroxide; and peroxyesters such as peroxydicarbonate. Of these, the dialkyl peroxides are preferred from the viewpoint of performance of the crosslinked resin. The kind of the alkyl group can be changed according to the curing temperature (forming or molding temperature).

No particular limitation is imposed on the amount of the organic peroxide blended. However, it is used within a range of generally 0.1 to 30 parts by weight, preferably 1 to 20 parts by weight per 100 parts by weight of the ring structure-containing polymer from the viewpoints of efficiently conducting a crosslinking reaction, improving the physical properties of the resulting cured polymer, and being profitable. If the blending amount is too little, the resulting composition becomes hard to undergo crosslinking, and so sufficient heat resistance and solvent resistance cannot be imparted to the composition. If the amount is too great on the other hand, the properties of the cured resin, such as water absorption property and dielectric properties are deteriorated. It is hence not preferred to use the organic peroxide in such a too small or great amount. The blending amount within the above range is preferred because these properties are balanced with each other at a high level.

(2) Hardening Agent Capable of Exhibiting its Effect by Heat

No particular limitation is imposed on the hardening agent capable of exhibiting its effect by heat so far as it can cause a crosslinking reaction by heating. However, specific preferable examples thereof include aliphatic polyamines, alicyclic polyamines, aromatic polyamines, bisazides, acid anhydrides, dicarboxylic acids, diols, polyhydric phenols, polyamides, diisocyanates and polyisocyanates.

Specific examples thereof include aliphatic polyamines such as hexamethylenediamine, triethylenetetramine, diethylenetriamine and tetraethylenepentamine; alicyclic polyamines such as diaminocyclohexane, 3(4),8(9)-bis(aminomethyl)tricyclo[5,2,1,0$^{2,6}$]decane, 1,3-(diaminomethyl)cyclohexane, menthenediamine, isophoronediamine, N-aminoethylpiperazine, bis(4-amino-3-methylcyclohexyl)methane and bis(4-aminocyclohexyl) methane; aromatic polyamines such as 4,4'-diaminodiphenyl ether, 4,4'-diaminodiphenylmethane, α,α'-bis(4-aminophenyl)-1,3-diisopropylbenzene, α,α'-bis(4-aminophenyl)-1,4-diisopropylbenzene, 4,4'-diaminodiphenyl sulfone, m-phenylenediamine and m-xylylenediamine; bisazides such as 4,4'-bisazidobenzal (4-methyl)cyclohexanone, 4,4'-diazidochalcone, 2,6-bis(4'-azidobenzal)cyclohexanone, 2,6-bis(4'-azidobenzal)-4-methylcyclohexanone, 4,4'-diazidodiphenylsulfone, 4,4'-diazidodiphenylmethane and 2,2'-diazidostilbene; acid anhydrides such as phthalic anhydride, pyromellitic anhydride, benzophenonetetracarboxylic acid anhydride, nadic anhydride, 1,2-cyclohexanedicarboxylic acid, maleic anhydride-modified polypropylene and maleic anhydride-modified cycloolefin resins; dicarboxylic acids such as fumaric acid, phthalic acid, maleic acid, trimellitic acid and himic acid; diols such as 1,3'-butanediol, 1,4'-butanediol, hydroquinonedihydroxydiethyl ether and tricyclodecanedimethanol; triols such as 1,1,1-trimethylolpropane; polyhydric phenols such as phenol novolak resins and cresol novolak resin; polyamides such as nylon 6, nylon 66, nylon 610, nylon 11, nylon 612, nylon 12, nylon 46, methoxymethylated polyamide, polyhexamethylenediamine terephthalamide and polyhexamethylene isophthalamide; and diisocyanates such as hexamethylene diisocyanate and tuluylene diisocyanate.

These hardening agents may be used either singly or in any combination thereof. Of these, the aliphatic polyamines and aromatic polyamines are preferred for reasons of easy uniform dispersion. Further, the aromatic polyamines from the viewpoint of excellent heat resistance, and the polyhydric phenols from the viewpoint of excellent strength properties are particularly preferred.

No particular limitation is imposed on the amount of the hardening agent blended. From the viewpoints of being able to efficiently conduct a crosslinking reaction and improve the physical properties of the resulting crosslinked resin, and being profitable, however, it is generally within a range of 0.1 to 30 parts by weight, preferably 1 to 20 parts by weight per 100 parts by weight of the ring structure-containing polymer. If the amount of the hardening agent is too little, the resulting composition becomes hard to undergo crosslinking, and so sufficient heat resistance and solvent resistance cannot be imparted to the composition. To the contrary, any amount too great results in a crosslinked resin lowered in properties such as water absorption property and dielectric properties. It is hence not preferred to use the hardening agent in any amount outside the above range. The blending amount within the above range is preferred because these properties are balanced with each other at a high level.

A hardening accelerator may also be blended, as needed, to enhance the efficiency of the crosslinking reaction. Examples of the hardening accelerator include amines such as pyridine, benzyldimethylamine, triethanolamine, triethylamine, tributylamine, tribenzylamine, dimethylformamide and imidazoles. The hardening accelerator is added in order to regulate curing rate and further enhance the efficiency of the crosslinking reaction. No particular limitation is imposed on the amount of the hardening accelerator blended. However, it is used within a range of generally 0.1 to 30 parts by weight, preferably 1 to 20 parts by weight per 100 parts by weight of the ring structure-containing polymer. The blending amount of the hardening accelerator within this range is preferred because crosslinking density, dielectric properties, water absorptivity and the like of the crosslinked resin are balanced with one another at a high level. Among others, imidazoles are preferred in that a cured resin excellent in dielectric properties can be provided.

(3) Hardening Agent Capable of Exhibiting its Effect by Light

No particular limitation is imposed on the hardening agent capable of exhibiting its effect by light so far as it is a photo-induced hardening agent which reacts with the ring structure-containing polymer by irradiation of actinic rays such as ultraviolet rays such as g rays, h rays or i rays, far ultraviolet rays, X rays, or electron rays to form a crosslinked compound. However, examples thereof include aromatic bisazide compounds, photo-induced mine generators and photo-induced acid generators.

Specific examples of the aromatic bisazide compounds include 4,4'-diazidochalcone, 2,6-bis(4'-azidobenzal)-cyclohexanone, 2,6-bis(4'-azidobenzal)-4-methylcyclohexanone, 4,4'-diazidodiphenyl sulfone, 4,4'-diazidobenzophenone, 4,4'-diazidophenyl, 2,7-diazidofluorene and 4,4'-diazidophenylmethane. These compounds may be used either singly or in any combination thereof.

Specific examples of the photo-induced amine generators include o-nitrobenzyloxycarbonylcarbamates, 2,6-dinitrobenzyloxycarbonylcarbamates and α,α-dimethyl-3,5-dimethoxybenzyloxycarbonylcarbamates of aromatic amines or aliphatic amines. More specifically, there may be mentioned o-nitrobenzyloxycarbonylcarbamates of aniline, cyclohexylamine, piperidine, hexamethylenediamine, triethylenetetramine, 1,3-(diaminomethyl)cyclohexane, 4,4'-diaminodiphenyl ether, 4,4'-diaminodiphenylmethane, phenylenediamine and the like. These compounds may be used either singly or in any combination thereof.

The photo-induced acid generator is a substance which forms a Brønsted acid or Lewis acid upon exposure to actinic rays. Examples thereof include onium salts, halogenated organic compounds, quinonediazide compounds, α,α-bis(sulfonyl)diazomethane compounds, α-carbonyl-α-sulfonyldiazomethane compounds, sulfone compounds, organic acid ester compounds, organic acid amide compounds and organic acid imide compounds. These compounds, which cleave upon exposure to the actinic rays to form an acid, may be used either singly or in any combination thereof.

No particular limitation is imposed on the amount of these photo-induced hardening agents blended. From the viewpoints of being able to efficiently conduct the reaction with the ring structure-containing polymer, not impairing the physical properties of the resulting crosslinked resin, and being profitable, however, it is generally within a range of 0.1 to 30 parts by weight, preferably 1 to 20 parts by weight per 100 parts by weight of the ring structure-containing polymer. If the amount of the photoreactive substance blended is too little, the resulting composition becomes hard to undergo crosslinking, and so sufficient heat resistance and solvent resistance cannot be imparted to the composition. On the other hand, any amount too great results in a crosslinked resin lowered in properties such as water absorption property and dielectric properties. It is hence not preferable to use the photoreactive compound in any amount outside the above range. The blending amount within the above range is preferred because these properties are balanced with each other at a high level.

Hardening Auxiliary (Curing Aid)

In the present invention, a curing aid (hardening aid) may be used for the purpose of more enhancing curability and the dispersibility of the compounding additives.

No particular limitation is imposed on the curing aid. Publicly known compounds disclosed in Japanese Patent Application Laid-Open No. 34924/1987 and the like may be used. Examples thereof include oxime.nitroso type curing aids such as quinone dioxime, benzoquinone dioxime and p-nitrosophenol; maleimide type curing aids such as N,N-m-phenylenebismaleimide; allyl type curing aids such as diallyl phthalate, triallyl cyanurate and triallyl isocyanurate; methacrylate type curing aids such as ethylene glycol dimethacrylate and trimethylolpropane trimethacrylate; and vinyl type curing aids such as vinyltoluene, ethylvinylbenzene and divinylbenzene. Of these, the allyl type curing aids and methacrylate type curing aids are preferred because they are easy to be uniformly dispersed.

The amount of the curing aid blended is suitably selected according to the kind of the hardener used. However, it is generally 0.1 to 10 parts by weight, preferably 0.2 to 5 parts by weight per part by weight of the hardener. If the amount of the curing aid blended is too little, the resulting composition becomes hard to undergo curing. On the other hand, any amount too great results in a crosslinked resin having a possibility that its electrical properties, moisture resistance and the like may be deteriorated.

Other Compounding Additives

Other compounding additives may be added to the resin compositions according to the present invention as needed. Examples of other compounding additives include flame retardants, other polymer components and other additives.

(1) Flame Retardant

It is preferred that a flame retardant be added to the resin composition when the composite film according to the present invention is used as a film for wiring boards such as flexible printed wiring boards. No particular limitation is imposed on the flame retardant. However, those which undergo none of decomposition, denaturation and deterioration by the hardening agent are preferred. Halogen-containing flame retardants are generally used.

Various kinds of chlorine- or bromine-containing flame retardants may be used as the halogen-containing flame retardants. From the viewpoints of flame proofing effect, heat resistance upon forming or molding, dispersibility in resins and influence on the physical properties of the resins, however, the following flame retardants may be preferably used. Namely, preferable examples thereof include hexabromobenzene, pentabromoethylbenzene, hexabromobiphenyl, decabromodiphenyl, hexabromodiphenyl oxide, octabromodiphenyl oxide, decabromodiphenyl oxide, pentabromocyclohexane, tetrabromobisphenol A and derivatives thereof [for example, tetrabromobisphenol A-bis(hydroxyethyl ether), tetrabromobisphenol A-bis(2,3-dibromopropyl ether), tetrabromobisphenol A-bis(bromoethyl ether), tetrabromobisphenol A-bis(allyl ether), etc.], tetrabromobisphenol S and derivative thereof [for example, tetrabromobisphenol S-bis(hydroxyethyl ether), tetrabromobisphenol S-bis(2,3-dibromopropyl ether), etc.], tetrabromophthalic anhydride and derivatives thereof [for example, tetrabromophthalimide, ethylenebistetrabromophthalimide, etc.], ethylenebis(5,6-dibromonorbornene-2,3-dicarboxyimide), tris-(2,3-dibromopropyl-1) isocyanurate, adducts of hexachlorocyclopentadiene by Diels-Alder reaction, tribromophenyl glycidyl ether, tribromophenyl acrylate, ethylenebistribromophenyl ether, ethylenebispentabromophenyl ether, tetradecabromodiphenoxybenzene, brominated polystyrene, brominated polyphenylene oxide, brominated epoxy resins, brominated polycarbonate, polypentabromobenzyl acrylate, octabromonaphthalene, hexabromocyclododecane, bis(tribromophenyl)fumaramide and N-methylhexabromodiphenylamine.

The amount of the flame retardant added is generally 3 to 150 parts by weight, preferably 10 to 140 parts by weight, particularly preferably 15 to 120 parts by weight per 100 parts by weight of the ring structure-containing polymer.

As a flame retardant auxiliary for causing the flame retardant to more effectively exhibit its flameproofing effect, for example, an antimonial flame retardant auxiliary such as antimony trioxide, antimony pentoxide, sodium antimonate or antimony trichloride may be used. These flame retardant auxiliaries are used in a proportion of generally 1 to 30 parts by weight, preferably 2 to 20 parts by weight per 100 parts by weight of the flame retardant.

(2) Other Polymer Component

In the present invention, rubbery polymers and other thermoplastic resins may be blended into the ring structure-containing polymer, as needed, for the purpose of imparting properties such as flexibility as a film.

The rubbery polymers are polymers having a glass transition temperature of ordinary temperature (25° C.) or lower and include general rubber-like polymers and thermoplastic elastomers. The Mooney viscosity ($ML_{1+4}$, 100° C.) of such a rubbery polymer is suitably selected as necessary for the end application intended and is generally 5 to 200.

Examples of the rubbery polymers include ethylene-α-olefin type rubbery polymers; ethylene-α-olefin-polyene terpolymer rubbers; copolymers of ethylene and an unsaturated carboxylic acid ester, such as ethylene-methyl methacrylate copolymers and ethylene-butyl acrylate copolymers; copolymers of ethylene and a fatty acid vinyl ester, such as ethylene-vinyl acetate copolymers; polymers of acrylic acid alkyl esters such as ethyl acrylate, butyl acrylate, hexyl acrylate, 2-ethyl-hexyl acrylate and lauryl acrylate; diene rubbers such as polybutadiene, polyisoprene, styrene-butadiene or styrene-isoprene random copolymers, acrylonitrile-butadiene copolymers, butadiene-isoprene copolymers, butadiene-alkyl (meth)acrylate copolymers, butadiene-alkyl (meth)acrylate-acrylonitrile terpolymers and butadiene-alkyl (meth)acrylate-acrylonitrile-styrene tetrapolymers; and butylene-isoprene copolymers.

As examples of the thermoplastic elastomers, may be mentioned aromatic vinyl-conjugated diene block copolymers such as styrene-butadiene block copolymers, hydrogenated styrene-butadiene block copolymers, styrene-isoprene block copolymers and hydrogenated styrene-isoprene block copolymers, low crystalline polybutadiene resins, ethylene-propylene elastomers, styrene-grafted ethylenepropylene elastomers, thermoplastic polyester elastomers, and ethylenic ionomer resins. Of these thermoplastic elastomers, the hydrogenated styrene-butadiene block copolymers and hydrogenated styrene-isoprene block copolymers are preferred. As specific examples thereof, may be mentioned those described in Japanese Patent Application Laid-Open Nos. 133406/1990, 305814/1990, 72512/1991 and 74409/1991, etc.

Examples of the other thermoplastic resins include low density polyethylene, high density polyethylene, linear low density polyethylene, very low density polyethylene, ethylene-ethyl acrylate copolymers, ethylene-vinyl acetate copolymers, polystyrene, poly(phenylene sulfide), poly(phenylene ether), polyamide, polyester, polycarbonate and cellulose triacetate.

These rubbery polymers and other thermoplastic resins may be used either singly or in any combination thereof. The blending amount thereof is suitably selected within limits not impeding the objects of the present invention. However, it is preferably at most 30 parts by weight per 100 parts by weight of the ring structure-containing polymer for reasons of not impeding the properties of the resulting insulating material.

(3) Other Additives

To the ring structure-containing polymers, may be added proper amounts of other additives such as heat stabilizers, weathering stabilizers, leveling agents, antistatic agents, slip agents, antiblocking agents, anti-fogging agents, lubricants, dyes, pigments, natural oil, synthetic oil, wax and the like as needed.

Specific examples thereof include phenolic antioxidants such as tetrakis[methylene-3(3,5-di-t-butyl-4-hydroxyphenyl)propionate]methane, alkyl β-(3,5-di-t-butyl-4-hydroxyphenyl)propionates and 2,2'-oxamidobis[ethyl-3 (3,5-di-t-butyl-4-hydroxyphenyl)propionate]; phosphoric stabilizers such as trisnonylphenyl phosphite, tris(2,4-di-t-butylphenyl)phosphite and tris(2,4-di-t-butylphenyl) phosphite; fatty acid metal salts such as zinc stearate, calcium stearate and calcium 12-hydroxystearate; polyhydric alcohol fatty acid esters such as glycerol monostearate, glycerol monolaurate, glycerol distearate, pentaerythritol monostearate, pentaerythritol distearate and pentaerythritol tristearate; synthetic hydrotalcite; amine type antistatic agents; leveling agents for paints, such as fluorine-containing nonionic surfactants, special acrylic resin type leveling agents and silicone type leveling agents; coupling agents such as silane coupling agents, titanate coupling agents, aluminum-containing coupling agents and zircoaluminate coupling agents; plasticizers; and colorants such as pigments and dyes.

These other compounding additives may be used either singly or in any combination thereof.

The blending of the ring structure-containing polymer with various compounding additives may be conducted in accordance with a method known per se in the art. Examples thereof include a method in which the compounding additives are dissolved or dispersed in a solution with the ring structure-containing polymer dissolved in a solvent to mix them, a method in which the compounding additives are mixed with the ring structure-containing polymer by means of a kneader such as a single-screw or twin-screw extruder, and a method in which the compounding additives are mixed with the ring structure-containing polymer by means of a film extruder upon forming.

(Film (A))

The film (A) used in the present invention is a film formed from the ring structure-containing polymer. The ring structure-containing polymer may be used singly, but is preferably used in the form of a resin composition with various kinds of compounding additives such as a hardening agent mixed therewith.

No particular limitation is imposed on the forming process of the film, and the film can be formed in accordance with a method known per se in the art. Examples of the forming process include melt extrusion and solution casting processes.

In the case of the melt extrusion process, a film can be formed from a state of pellets by means of a film extruder or the like heretofore used.

In the case of the solution casting (cast) process, a film is formed with a liquid composition obtained by further adding a solvent to a ring structure-containing polymer or a resin composition containing the ring structure-containing polymer.

When the solvent is used, examples thereof include aromatic hydrocarbons such as toluene, xylene and ethylbenzene; aliphatic hydrocarbons such as n-pentane, hexane and heptane; alicyclic hydrocarbons such as cyclohexane; and halogenated hydrocarbons such as chlorobenzene, dichlorobenzene and trichlorobenzene.

The solvent is used in an amount sufficient to uniformly dissolve or disperse the ring structure-containing polymer and the individual components optionally blended therein. The amount of the solvent used is generally controlled in such a manner that a solids concentration amounts to 1 to 80 wt. %, preferably 5 to 60 wt. %, more preferably 10 to 50 wt. %. A curable monomer may also be used as a reactive diluent in place of the solvent. No particular limitation is imposed on the reactive diluent so far as it is a compound which can cause a curing reaction by heat or light and is liquid at ordinary temperature. However, specific examples thereof include epoxy group-containing compounds, (meth)acrylic acid ester compounds, vinyl ether compounds and vinyl compounds. Of these, the epoxy group-containing compounds are particularly preferred for reasons of imparting excellent heat resistance, low water absorption property, dielectric properties and the like.

The melt viscosity of the ring structure-containing polymer is preferably at most 50 poises, more preferably at most 20 poises in a temperature range of 100 to 200° C. for reasons of merits in handling and process.

The film (A) used in the present invention may be stretched after forming.

The thickness of the film (A) used in the present invention is suitably selected as necessary for the end application intended, but is generally within a range of 5 to 500 μm, preferably 10 to 300 μm, more preferably 20 to 200 μm. Any film thickness falling within this range is preferred because the strength properties, reliability and flexibility of the resulting composite film are balanced with one another at a high level. If the thickness of the film (A) is too thin, reliability on insulation and mechanical strength of the resulting composite film are lowered. If the thickness is too great, it is difficult to form minute wiring, and the flexibility of the resulting composite film is also lowered.

The glass transition temperature (Tg) of the film (A) used in the present invention is suitably selected as necessary for the end application intended, but is generally within a range of 100 to 500° C., preferably 130 to 400° C., more preferably 160 to 350° C. Any glass transition temperature falling within this range is preferred because the properties of the resulting composite film, such as forming and processing ability, solder resistance and flame retardant are balanced with one another.

The dielectric constant of the film (A) used in the present invention is suitably selected as necessary for the end application intended. When the dielectric constant is generally at most 5.0, preferably at most 4.0, more preferably at most 3.5, most preferably at most 3.0 as measured at 1 MHz, however, the properties of the resulting composite film, such as reliability on insulation and speeding-up ability as a circuit board become far excellent. Therefore, it is preferable to use a film having such a dielectric constant.

The dielectric loss tangent of the film (A) used in the present invention is suitably selected as necessary for the end application intended. When the dielectric loss tangent is generally at most 0.10, preferably at most 0.05, more preferably at most 0.01 as measured at 1 MHz, however, the properties of the resulting composite film, such as high-frequency properties and low transmission loss as a circuit board become far excellent. Therefore, it is preferable to use a film having such a dielectric loss tangent.

The water absorptivity of the film (A) used in the present invention is suitably selected as necessary for the end application intended. When the water absorptivity is generally at most 0.50%, preferably at most 0.10%, more preferably at most 0.05%, however, the properties of the resulting composite film, such as solder resistance and resistance to ion migration become excellent. Therefore, it is preferable to use a film having such a water absorptivity.

When the film (A) used in the present invention is formed from a curable resin composition comprising the ring structure-containing polymer and the hardening agent, the film may be cured (crosslinked) by heating or exposure to light during or after the formation of the film, or after the formation of a composite film.

Film (B) Formed from Polycondensation Polymer
(Polycondensation Polymer)

No particular limitation is imposed on the polycondensation polymer used in the present invention, and any industrially generally known polymer may be used. Specific examples thereof include polyether resins such as poly (phenylene ether), poly(phenylene oxide); thermoplastic polyester resins such as polyethylene terephthalate, polybutylene terephthalate and liquid crystal polyester; polyamide resins; and polyimide resins. Of these, the polyester resins and polyimide resins are preferred from the viewpoints of mechanical strength, heat resistance, etc. Further, the liquid crystal polyester resin and polyimide resins are more preferred from the viewpoints of flame retardant and the like, with the polyimide resins being particularly preferred in that they have high mechanical strength, heat resistance and flame retardant.

When an aromatic ring is present in the polycondensation polymer, the adaptability of the film, such as adhesion property to the ring structure-containing polymer film (A) and various physical properties (elongation, coefficient of linear expansion and molding shrinkage) are improved. Therefore, it is pertinent to control the content of the monomer unit having an aromatic ring in the polycondensation polymer be controlled to at least 10 wt. %, preferably at least 30 wt. %, more preferably at least 50 wt. %.

A preferred polyimide resin in the present invention is a resin synthesized from a tetracarboxylic acid dianhydride and a diamine both having an aromatic ring. This resin is far excellent in mechanical strength and heat resistance. The polyimide resins also include polyamide-imide resins obtained by the reaction of an aromatic tricarboxylic acid anhydride with an aromatic diamine in addition to such condensation type overall aromatic polyimide resins.

When examples of preferred polyimide resins are mentioned as combination of a tetracarboxylic acid dianhydride and a diamine, there may be mentioned, for example, polycondensation products of pyromellitic acid dianhydride (PMDA) and oxydianiline (ODA); polycondensation products of biphenyltetracarboxylic acid dianhydride (BTDA) and p-phenylenediamine (PPD); and polycondensation products of benzophenonetetracarboxylic acid dianhydride (BTDA) and benzophenonediamine (BDA). Of these, the polycondensation products of BTDA and PPD are most preferred in that they are excellent in heat resistance and mechanical strength. A polyimide resin is generally formed into a film by forming a film with a precursor (polyamic acid) thereof and then cyclodehydrating the polyamic acid to imidate it.

The solution viscosity of the polycondensation polymer is generally at least 0.05 dl/g, preferably at least 0.1 dl/g in terms of inherent viscosity $\eta_{inh}$ at 30° C. in dimethylformamide (DMF). When the solution viscosity of the polycondensation polymer falls within this range, the mechanical strength and film-forming property of the polymer are well balanced with each other. It is hence preferred to use a polycondensation polymer having a solution viscosity within this range.

These polycondensation polymers may be used either singly or in any combination thereof.

The film (B) used in the present invention may contain various kinds of compounding additives, as needed, in addition to the polycondensation polymer. Namely, the film (B) may be formed from a resin composition. The kinds, blending proportions and mixing method of the compounding additives are the same as those in the case of the film (A).

The film (B) used in the present invention is obtained by forming the polycondensation polymer or the resin composition comprising the polycondensation polymer and the compounding additives. The film can be formed in accordance with a method known per se in the art, and the process thereof is the same as in the case of the film (A). However, when the film is formed through a precursor of the polymer like the polyimide resin, for example, an imidation reaction by cyclodehydration of polyamic acid is required.

The thickness of the film (B) used in the present invention is suitably selected as necessary for the end application intended, but is generally within a range of 5 to 500 μm, preferably 10 to 300 μm, more preferably 20 to 200 μm. Any film thickness falling within this range is preferred because the strength properties, reliability and flexibility of the film are balanced with one another at a high level. If the thickness of the film (B) is too thin, reliability on insulation and mechanical strength of the film are lowered. If the thickness is too great, it is difficult to form minute wiring, and the flexibility of the film is also lowered.

The glass transition temperature (Tg) of the film (B) used in the present invention is suitably selected as necessary for the end application intended, but is generally within a range of 100 to 500° C., preferably 150 to 400° C., more preferably 200 to 350° C. Any glass transition temperature falling within this range is preferred because the reliability and forming and processing ability of the resulting composite film are balanced with each other.

The dielectric constant of the film (B) used in the present invention is suitably selected as necessary for the end application intended, but it is generally at most 5.0, preferably at most 4.0, more preferably at most 3.5 as measured at 1 MHz.

The dielectric loss tangent of the film (B) used in the present invention is suitably selected as necessary for the end application intended, but it is generally within a range of 0.005 to 0.03, preferably 0.001 to 0.02, more preferably 0.002 to 0.01 as measured at 1 MHz.

The tensile strength of the film (B) used in the present invention is suitably selected as necessary for the end application intended, but is generally within a range of 100 to 400 MPa, preferably 150 to 300 MPa, more preferably 200 to 250 MPa.

The elastic modulus of the film (B) used in the present invention is suitably selected as necessary for the end application intended, but is generally within a range of 1.5 to 10 GPa, preferably 2.0 to 9 GPa, more preferably 3.0 to 8 GPa.

The elongation of the film (B) used in the present invention is suitably selected as necessary for the end application intended, but is generally within a range of 30 to 150%, preferably 40 to 120%, more preferably 50 to 100%.

The water absorptivity of the film (B) used in the present invention is suitably selected as necessary for the end application intended, but it is generally within a range of 0.1 to 0.5%, preferably 0.2 to 0.4%, more preferably 0.25 to 0.35%.

(Composite Film)

The composite film according to the present invention is a multi-layer film having a layer structure of at least two layers, wherein the ring structure-containing polymer film (A) and the polycondensation polymer film (B) adjoin each other directly or through an adhesive layer.

No particular limitation is imposed on the layer structure of the composite film according to the present invention, and examples thereof include (A)/(B), (A)/(B)/(A), (B)/(A)/(B), (A)/(B)/(A)/(B), (A)/(B)/(A)/(B)/(A) and (B)/(A)/(B)/(A)/(B). The number of layers may be increased more than this as needed. However, the number of layers is generally at most 10 layers, preferably at most 7 layers, more preferably at most 5 layers in total from the viewpoints of flexibility and profitability. In many cases, good results can be achieved by 2 or 3 layers.

The composite films may be classified by the layer structure and which side the film (A) or (B) is arranged on. There are composite films having a layer structure that these two kinds of films are contained more than 2 layers in total, and the film (A) or (B) is arranged on each side. Specific examples thereof include (A)/(B)/(A), (A)/(B)/(A)/(B)/(A), (B)/(A)/(B) and (B)/(A)/(B)/(A)/(B).

There are composite films having a layer structure that these two kinds of films are contained more than 1 layer in total, the film (A) is arranged on one side thereof, and the film (B) is arranged on the other side. Specific examples thereof include (A)/(B) and (A)/(B)/(A)/(B).

Of these, composite films at least one side of which is composed of the film (A) are preferred in the application fields of which low absorption property is particularly required, with composite films both sides of which are composed of the film (A) being particularly preferred. On the other hand, composite films at least one side of which is composed of the film (B) are preferred in the application fields of which flame retardant is particularly required, with composite films both sides of which are composed of the film (B) being particularly preferred.

Processes for forming a composite film (multi-layer film) from the films (A) and (B) is not limited to particular processes. Typical processes thereof will hereinafter be described.

A first process is a process in which the film (A) preformed is used as a support, a solution of the polycondensation polymer (or a precursor thereof) which is a material for the film (B) is applied to the surface of the support, and the solution is then dried and completely cured as needed to form a composite film. When the film (A) contains a hardening agent, it may be cured at the same time as the curing of the film (B).

A second process is a process in which the film (B) preformed is used as a support, a solution of the ring structure-containing polymer which is a material for the film (A) is applied to the surface of the support, and the solution is then dried to form a composite film. When the ring structure-containing polymer is provided as a resin composition comprising a hardening agent, it may be cured (crosslinked) by a heat treatment or exposure to light after drying.

A third process is a process in which the films (A) and (B) preformed are laminated on each other and fusion-bonded to each other under pressure by means of a hot press or the like. In this case, when the film (A) contains a hardening agent, similarly it may be cured at the same time as the fusion bonding under pressure or after the fusion bonding under pressure.

A fourth process is a process in which the films (A) and (B) preformed are bonded to each other through an adhesive layer. The adhesive layer is formed by applying an adhesive to the surface of at least one film or by interposing an adhesive film between both films.

A fifth process is a process in which polymers for both films are co-extruded from an extruder to form a composite film when the polycondensation polymer is a thermoplastic resin. In this case, an adhesive layer may also be co-extruded.

These processes are carried out either singly or successively, whereby a multi-layer film of at least two layers can be formed.

Among the above-described processes, the first and second processes are particularly preferred because the formation of the respective films (A) and (B), and the formation of the multi-layer film can be conducted at the same time, and the process is simple.

The thickness of the composite film according to the present invention is suitably selected as necessary for the end application intended, but is generally within a range of 10 to 800 $\mu$m, preferably 15 to 500 $\mu$m, more preferably 20 to 300 $\mu$m. Any film thickness falling within this range is preferred because the strength properties, reliability and flexibility of the composite film are balanced with one another at a high level.

The thickness ratio of the film (A) to the film (B) in the composite films according to the present invention is suitably selected as necessary for the end application intended.

When the thickness ratio is generally within a range of 99:1 to 1:99, preferably 90:10 to 10:90, more preferably 80:20 to 20:80, however, the mechanical strength, flexibility, low water absorption property and flame retardant of such a composite film are balanced with one another at a high level. It is hence preferable for the thickness ratio to fall within this range.

The fundamental physical properties of the composite films according to the present invention are as follows:

(i) the dielectric constant as measured at 1 MHz is generally 2.3 to 3.0, preferably 2.5 to 2.8;

(ii) the dielectric loss tangent as measured at 1 MHz is generally 0.005 to 0.03, preferably 0.01 to 0.02;

(iii) the water absorptivity as determined under conditions of a temperature of 85° C., a relative humidity of 85% and measuring time of 300 hours is generally 0.05 to 0.3%, preferably 0.07 to 0.2%, more preferably 0.08 to 0.15%;

(iv) the tensile strength is generally 50 to 400 MPa, preferably 100 to 300 MPa, more preferably 150 to 200 MPa;

(v) the elastic modulus is generally 1.5 to 10 GPa, preferably 2.0 to 9 GPa, more preferably 3.0 to 8 GPa; and (vi) the tensile elongation is generally 10 to 100%, preferably 30 to 80%, more preferably 40 to 60%.

The composite films according to the present invention preferably have at least one of the above-described physical properties, more preferably the physical properties (i) to (iv), most preferably all the physical properties.

The composite films according to the present invention preferably exhibit flame retardant of V-0 in accordance with the UL standard.

(Conductive Layer)

The composite film according to the present invention is suitable for use as a film for wiring boards. When it is used in this application field, a conductive layer is generally formed on at least one side thereof.

The conductive layer formed on the composite film in the present invention is composed of a layer of a metal such as copper. More specifically, the conductive layer may be formed by a method of laminating a metal foil such as copper foil (electrolytic copper foil or rolled copper foil) on the surface of the composite film, a method of plating the surface of the composite film with a metal, a method of forming a metal film on the surface of the composite film by sputtering, or the like. When the composite film is used as a film for wiring boards, it is used in a state that a wiring pattern has been formed thereon.

An example of a process for forming a wiring pattern includes a process comprising forming a metal foil layer composed of copper or the like as a conductive layer on the composite film, forming a resist pattern by a photolithographic method making use of a mask pattern, and removing unnecessary portions of the metal foil layer by etching to form a wiring pattern. Besides, a wiring pattern may also be formed on the composite film by sputtering or plating.

The thickness of the conductive layer is generally 1 to 100 $\mu$m, preferably 5 to 30 $\mu$m, more preferably 10 to 20 $\mu$m. When the thickness of the conductive layer falls within the above range, both properties of reliability and minute processing ability are balanced with each other at a high level. It is hence preferable for the thickness to fall within this range.

The composite film on which the wiring pattern has been formed is useful in an application field of a film for wiring boards in flexible printed wiring boards, carrier films of semiconductor packages, wiring boards for semiconductor chip mounting, etc.

As more specific uses, they may be used in a great number of application fields as flexible printed circuit boards (FPC) for connecting printed boards used in potable information apparatus such as electronic pocketbooks, personal computers, potable telephones and PHS, and image processing apparatus such as digital cameras and camcoders; tapes for tape automated bonding (TAB); carrier films and base films for tape carrier packages (TCP), chip size packages (CSP) and the like as semiconductor packages; high-density multi-layer interconnection layers for packages such as multi-chip module and ballbrid array; etc.

Examples of specific forms of CSP include $\mu$-BGA, FBGA, FLGA, SON, SOL and mold CSP. The carrier film or base film is provided between layers of a semiconductor chip and a connecting member (lead, bump, etc.) as an insulating film for each of the above-described packages.

EXAMPLES

The present invention will hereinafter be described more specifically by the following Synthesis Examples, Examples and Comparative Examples. All designations of "part" or "parts" as will be used in these examples and the like mean part or parts by weight.

[Testing and Evaluating Methods]

(1) The glass transition temperature (Tg) was measured in accordance with the differential scanning calorimetry (DSC method).

(2) The molecular weight was determined in terms of polystyrene as measured by gel permeation chromatography (GPC) using toluene as a solvent unless expressly noted.

(3) The rate of hydrogenation in a main chain and the modification rate of a polymer were determined by $^1$H-NMR.

(4) The dielectric constant and dielectric loss tangent at 1 MHz were determined in accordance with JIS C 6481.

(5) The flexural strength, tensile strength and tensile elongation at an ordinary temperature, and the water absorptivity under conditions of a temperature of 85° C., RH of 85% and measuring time of 300 hours were determined in accordance with JIS K 6911.

(6) A temperature cycle test (TCT) was conducted by repeating a temperature cycle of "–55° C. (30 min)→room temperature (5 min)→150° C. (30 min)→room temperature (5 min)" 500 times to apply temperature shock to a composite film sample, thereby investigating whether cracking occurred or not.

(7) A pressure cooker test (PCT) was conducted by leaving a composite film sample to stand for 300 hours under an environment of 100% in humidity and 105° C. to investigate whether failure occurred or not.

Synthesis Example 1

Synthetic Example of Ring Structure-containing Polymer

Tungsten hexachloride, triisobutylaluminum and isobutyl alcohol were used as a polymerization catalyst to polymerize 8-ethyltetracyclo[4.4.1$^{2,5}$.1$^{7,10}$.0]-dodec-3-ene (i.e., ethyltetracyclododecene; hereinafter abbreviated as ETD) in accordance with a publicly known process. The thus-obtained ring-opening polymer was hydrogenated using nickel acetylacetonate and triisobutylaluminum as hydrogenation catalyst in accordance with a publicly known process to obtain a hydrogenated product of the ring-opening polymer of ETD (hydrogenation rate≧99%, Tg=138° C., Mn=18,500, Mw=31,600).

With 100 parts of the hydrogenated product were mixed 30 parts of maleic anhydride, 10 parts of dicumyl peroxide and 300 parts of tert-butylbenzene to conduct a graft modification reaction at 150° C. for 4 hours in an autoclave. The reaction mixture thus obtained was then solidified, and the solidified product was dried to obtain a maleic anhydride-modified polymer (a1). The modified polymer (a1) thus obtained had Tg of 166° C., Mn of 16,400, Mw of 35,200 and a modification rate of 28%.

When 15 parts of the modified polymer (a1) and 0.6 parts of 4,4'-bisazidobenzal(4-methyl)cyclohexane as a crosslinking agent were dissolved in 45 parts of xylene, a uniform solution was provided without forming any precipitate.

Synthesis Example 2

Synthetic Example of Ring Structure-containing Polymer

An epoxy-modified polymer (a2) was obtained in the same manner as in Synthesis Example 1 except that 30 parts of maleic anhydride were changed to 30 parts of allyl glycidyl ether. The modified polymer (a2) thus obtained had Tg of 160° C., Mn of 17,100, Mw of 36,900 and a modification rate of 24%.

When 15 parts of the modified polymer (a2) and 0.6 parts of 4,4'-bisazidobenzal(4-methyl)cyclohexane as a crosslinking agent were dissolved in 45 parts of xylene, a uniform solution was provided without forming any precipitate.

Synthesis Example 3

Synthetic Example of Ring Structure-containing Polymer

A glass container purged with nitrogen was charged with 150 parts of toluene, 50 parts of a 67% toluene solution of 2-norbornene (hereinafter abbreviated as NB) and 35 parts of 5-decyl-2-norbornene (hereinafter abbreviated as DNB). Then, 10 parts of a toluene solution (2.5 mmol/l) of nickel acetylacetonate and 10 parts of a toluene solution (500 mmol/l) of ethylaluminum dichloride were added to conduct a polymerization reaction at 50° C. for 5 hours. After completion of the reaction, the reaction mixture was poured into a large amount of methanol to deposit a polymer formed. The polymer was collected by filtration, washed and then dried under reduced pressure, thereby obtaining 45 parts of an addition copolymer. The addition copolymer had Mn of 69,200, Mw of 132,100, a compositional ratio NB/DNB of monomers of 76/24 (molar ratio) and Tg of 270° C.

Dissolved in 130 parts of t-butylbenzene were 28 parts of the addition copolymer obtained above, 10 parts of 5,6-epoxy-1-hexene and 2 parts of dicumyl peroxide, and a graft modification reaction was conducted at 140° C. for 6 hours. The thus-obtained solution of a reaction product was poured into 300 parts of methanol to solidify the reaction product. The epoxy-modified polymer thus solidified was dried under vacuum at 100° C. for 20 hours, thereby obtaining 26 parts of an epoxy-modified norbornene polymer (a3). This modified polymer had Mn of 72,600, Mw of 141,400 and Tg of 275° C. The epoxy group content in the modified polymer was 7.4% per repeating structural unit of the polymer as measured by $^1$H-NMR.

When 15 parts of the modified polymer (a3) and 0.6 parts of 4,4'-bisazidobenzal(4-methyl)cyclohexane as a crosslinking agent were dissolved in 45 parts of xylene, a uniform solution was provided without forming any precipitate.

Example 1

A solution of the maleic anhydride-modified polymer (a1) obtained in Synthesis Example 1 was applied on to a conventional polyimide film (Eupilex Film, product of Ube Industries, Ltd.; thickness: 50 μm) for flexible printed boards by means of a spin coater and then heated at 80° C. for 15 minutes to remove the solvent and dry the solution, thereby forming a coating film of the maleic anhydride-modified polymer (a1) having a thickness of 50 μm.

After an electrolytic copper foil having a thickness of 18 μm was press-bonded under heating on to the coating film of the maleic anhydride-modified polymer (a1) at 250° C. for 5 minutes, the coating film was heated at 170° C. for 4 hours to completely cure the resin, thereby forming a composite film having a conductive layer.

A resist film was formed on the conductive layer of the thus-obtained composite film having the conductive layer using a photolithographic method. After the resist film was exposed on a pattern through a photomask and developed, unnecessary portions of the copper foil were removed with an etching agent to form a wiring pattern. The properties of the composite film on which the wiring pattern had been formed were evaluated. The results were as follows:

water absorptivity=0.175%;

dielectric constant=2.8;

dielectric loss tangent=0.0035;

tensile strength=180 MPa; and flame retardant=V-0 (UL standard).

(Production of Tape Carrier Package, TCP)

A semiconductor chip was mounted on the composite film, on which the wiring pattern had been formed, by bare chip bonding through a lead, and a TCT test and a PCT test were performed thereon to determine percent defective. As a result, it was at most 5% in each test.

Example 2

Evaluation was conducted in the same manner as in Example 1 except that a solution of the epoxy-modified polymer (a2) obtained in Synthesis Example 2 was used. As a result, the properties of the composite film were found to be as follows:

water absorptivity=0.173%;

dielectric constant=2.75;

dielectric loss tangent=0.0033;

tensile strength=183 MPa; and flame retardant=V-0 (UL standard).

Similarly, the results (percent defective) of both TCT test and PCT test on the composite film were also found to be at most 5%.

Example 3

Evaluation was conducted in the same manner as in Example 1 except that a solution of the epoxy-modified polymer (a3) obtained in Synthesis Example 3 was used. As a result, the properties of the composite film were found to be as follows:

water absorptivity=0.170%;

dielectric constant=2.70;

dielectric loss tangent=0.0032;

tensile strength=175 MPa; and flame retardant=V-0 (UL standard).

Similarly, the results (percent defective) of both TCT test and PCT test on the composite film were also found to be at most 5%.

Comparative Example 1

Evaluation was conducted by using a single polyimide film (Eupilex Film) having a thickness of 100 μm in place of the composite film used in Example 1. As a result, the properties of the film were found to be as follows:

water absorptivity 0.30%;

dielectric constant=3.2;

dielectric loss tangent=0.03;

tensile strength=300 MPa; and flame retardant=V-0 (UL standard).

The result (percent defective) of the TCT test on the film was found to be at most 5%, but the result (percent defective) of the PCT test was found to be as high as 12%.

Example 4

A solution of the maleic anhydride-modified polymer (a1) obtained in Synthesis Example 1 was applied on to a conventional polyimide base film (thickness: 25 μm) for LOC (lead on chip) packaging tapes by means of a spin coater and then heated at 80° C. for 15 minutes to remove the solvent and dry the solution, thereby forming a coating film of the maleic anhydride-modified polymer (a1) having a thickness of 25 μm. The coating film of the maleic anhydride-modified polymer (a1) was heated at 170° C. for 4 hours to completely cure the resin, thereby forming a composite film.

The properties of the composite film thus obtained were evaluated. The results were as follows:

water absorptivity=0.175%;

dielectric constant=2.8; and dielectric loss tangent=0.0035.

(Production of LOC Package)

The above-obtained composite film was sandwiched between a lead and a semiconductor chip to bond them to each other, thereby producing a LOC package (a sort of CSP). A TCT test and a PCT test were carried out on the package to determine percent defective. As a result, it was at most 5% in each test.

Comparative Example 2

A LOC package was produced in the same manner as in Example 4 except that a single polyimide base film (thickness: 50 μm; Eupilex Film) was used in place of the composite film, thereby evaluating it. As a result, it was found that the percent defective in the TCT test was at most 5%, the percent defective in the PCT test was 14%, and the flame retardant was V-0 in accordance with the UL standard.

Comparative Example 3

A solution of the maleic anhydride-modified polymer (a1) obtained in Synthesis Example 1 was applied on to a silicon wafer by means of a spin coater and then heated at 80° C. for 15 minutes to remove the solvent and dry the solution, thereby forming a coating film of the maleic anhydride-modified polymer (a1) having a thickness of 100

After an electrolytic copper foil having a thickness of 18 μm was press-bonded under heating on to the coating film at 250° C. for 5 minutes, the coating film of the polymer was heated at 170° C. for 4 hours to completely cure the resin. The coating film was then peeled from the silicon wafer to form a film having a conductive layer.

A resist film was formed on the conductive layer of the thus-obtained film having the conductive layer using a photolithographic method. After the resist film was exposed on a pattern through a photomask and developed, unnecessary portions of the copper foil were removed with an etching agent to form a wiring pattern. The properties of the film on which the wiring pattern had been formed were evaluated. The results were as follows:

water absorptivity=0.05%;

dielectric constant=2.4;

dielectric loss tangent=0.0007;

tensile strength=50 MPa; and flame retardant=HB (UL standard).

From the comparison of the above-descried Examples with the Comparative Examples, it was confirmed that the composite films according to the present invention are excellent in balance among low water absorption property, dielectric properties and mechanical strength, and reliability of the flexible printed wiring boards and semiconductor packages produced with such a composite film is also excellent.

INDUSTRIAL APPLICABILITY

According to the present invention, there are provided composite films excellent in balance among low water absorption property, dielectric properties and mechanical strength. According to the present invention, there are also provided flexible printed wiring boards and wiring films for semiconductor packages, which are produced with such a composite film and excellent in reliability on both TCT test and PCT test, and further semiconductor packages using such a wiring film.

What is claimed is:

1. A composite film having a layer structure of at least two layers, wherein a film layer (A) formed from a resin composition comprising a ring structure-containing polymer comprising a repeating unit derived from ring-opening or addition polymerization of a monomer having a ring structure, and a hardening agent, and a film layer (B) formed from a polycondensation polymer selected from the group consisting of polyether resin, thermoplastic polyester resin, polyamide resin and polyimide resin adjoin each other directly or through an adhesive layer.

2. The composite film according to claim 1, wherein the ring structure-containing polymer is at least one (co)polymer selected from the group consisting of:

(a) a ring-opening or addition (co)polymer of a norbornene monomer;

(b) an addition (co)polymer of a monocyclic cycloolefin monomer;

(c) an addition (co)polymer of a cyclic conjugated diene monomer;

(d) an addition (co)polymer of a vinyl cyclic hydrocarbon; and (e) a modified product of any one of these (co)polymers.

3. The composite film according to claim 2, wherein the ring-opening or addition (co)polymer of the norbornene monomer is at least one norbornene polymer selected from the group consisting of:

(1) a ring-opening (co)polymer of the norbornene monomer;

(2) an addition (co)polymer of the norbornene monomer; and (3) an addition copolymer of the norbornene monomer with another monomer copolymerizable with the norbornene monomer.

4. The composite film according to claim 1, wherein the ring structure-containing polymer comprises a monomer having an organic group having at least 2 carbon atoms in its side chain.

5. The composite film according to claim 2, wherein the modified product (e) of the (co)polymer is obtained by modifying each of the polymers (a) to (d) by a modification reaction selected from the group consisting of:

① a hydrogenation reaction of carbon-carbon unsaturated bonds;

② a graft reaction of a functional group-containing unsaturated compound;

③ a reaction for introducing a functional group by direct modification of a carbon-carbon unsaturated bond; and ④ combinations of these reactions.

6. The composite film according to claim 2, wherein the ring structure-containing polymer is at least one thermoplastic norbornene resin selected from the group consisting of the ring-opening or addition (co)polymer (a) of the norbornene monomer and modified products thereof.

7. The composite film according to claim 6, wherein the thermoplastic norbornene resin is at least one selected from the group consisting of norbornene polymers having a polar group as a functional group, and modified products obtained by introducing a polar group into the ring-opening or addition (co)polymer (a) of the norbornene monomer by a modification reaction.

8. The composite film according to claim 1, wherein the hardening agent is an organic peroxide, a hardening agent exhibiting its effect by heat, or a hardening agent exhibiting its effect by light.

9. The composite film according to claim 1, wherein the film (A) is a film formed from a resin composition containing a flame retardant in addition to the ring structure-containing polymer and the hardening agent.

10. The composite film according to claim 1, wherein the composite film is a composite film containing at least two layers of the film layer (A) or the film layer (B) and having a layer structure wherein the film layer (A) or the film layer (B) is arranged on both sides thereof.

11. The composite film according to claim 10, which has a layer structure of (A)/(B)/(A), (A)/(B)/(A)/(B)/(A), (B)/(A)/(B) or (B)/(A)/(B)/(A)/(B).

12. The composite film according to claim 1, wherein the composite film is a composite film having a layer structure wherein the film layer (A) is arranged on one side thereof, and the film layer (B) is arranged on the other side.

13. The composite film according to claim 12, which has a layer structure of (A)/(B) or (A)/(B)/(A)/(B).

14. The composite film according to claim 1, wherein the composite film has at least one physical property selected from the group consisting of:

(i) a dielectric constant as measured at 1 MHz of 2.3 to 3.0;

(ii) a dielectric loss tangent as measured at 1 MHz of 0.005 to 0.03;

(iii) a water absorptivity as determined under conditions of a temperature of 85° C., a relative humidity of 85% and measuring time of 300 hours of 0.05 to 0.3%; and (iv) a tensile strength of 50 to 400 MPa.

15. The composite film according to claim 1, wherein the ring structure-containing polymer is a thermoplastic norbornene resin, and the polycondensation polymer is a polyimide resin.

16. The composite film according to claim 1, further comprising a conductive layer on at least one side of the composite film.

17. The composite film according to claim 16, wherein the conductive layer is formed on at least one side of the composite film by lamination of a metal foil, plating with a metal or sputtering of a metal.

18. The composite film according to claim 17, wherein a wiring pattern is formed in the conductive layer.

19. The composite film according to claim 1, wherein the composite film is a film for wiring board.

20. The composite film according to claim 19, wherein the wiring board is a wiring board for a semiconductor package, flexible printed wiring board or wiring board for semiconductor chip mounting.

21. A composite film having a layer structure of at least two layers, wherein a film layer (A) formed from a ring structure-containing polymer, which comprises a repeating unit derived from ring-opening polymerization of a monomer having a ring structure, carbon-carbon double bonds present in the main chain of which are saturated by hydrogenation, and in which a function group is introduced in a proportion of 1 to 30 mol % based on the repeating unit in the polymer, and a film layer (B) formed from a polycondensation polymer selected from the group consisting of polyether resin, thermoplastic polyester resin, polyamide resin and polyimide resin adjoin each other directly or through an adhesive layer.

22. A composite film having a layer structure of at least two layers, wherein a film layer (A) formed from a ring structure-containing polymer comprising a repeating unit derived from addition polymerization of a monomer having a ring structure, and a film layer (B) formed from a polycondensation polymer selected from the group consisting of polyether resin, thermoplastic polyester resin polyamide resin and polyimide resin adjoin each other directly or through an adhesive layer.

\* \* \* \* \*

UNITED STATES PATENT AND TRADEMARK OFFICE
CERTIFICATE OF CORRECTION

PATENT NO. : 6,270,900 B1
DATED : August 7, 2001
INVENTOR(S) : Yasuhiro Wakizaka et al.

It is certified that error appears in the above-identified patent and that said Letters Patent is hereby corrected as shown below:

Column 30, claim 22,
Line 51, change "resin polyamide" to -- resin, polyamide --.

Signed and Sealed this

Fifth Day of March, 2002

Attest:

JAMES E. ROGAN
*Attesting Officer*     *Director of the United States Patent and Trademark Office*